(12) United States Patent
Iijima et al.

(10) Patent No.: US 7,033,934 B2
(45) Date of Patent: Apr. 25, 2006

(54) METHOD OF PRODUCTION OF SEMICONDUCTOR PACKAGE

(75) Inventors: Takahiro Iijima, Nagano (JP); Akio Rokugawa, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 181 days.

(21) Appl. No.: 10/693,374

(22) Filed: Oct. 24, 2003

(65) Prior Publication Data

US 2004/0238949 A1 Dec. 2, 2004

Related U.S. Application Data

(62) Division of application No. 10/281,791, filed on Oct. 28, 2002, now abandoned.

(30) Foreign Application Priority Data

Nov. 7, 2001 (JP) .............................. 2001-341643

(51) Int. Cl.
*H01L 21/44* (2006.01)

(52) U.S. Cl. .................. 438/667; 438/637; 438/639; 438/672; 438/386

(58) Field of Classification Search ................ 438/637, 438/639, 640, 667, 672, 675, 381, 386; 174/262, 174/266; 361/321.2; 257/698
See application file for complete search history.

(56) References Cited

U.S. PATENT DOCUMENTS 6,072,690 A * 6/2000 Farooq et al. ........... 361/321.2

6,314,013 B1 * 11/2001 Ahn et al. ..................... 365/63
6,605,551 B1 * 8/2003 Wermer et al. ............. 438/778
6,717,071 B1 * 4/2004 Chang et al. ............... 174/266
2002/0017399 A1 * 2/2002 Chang et al. ............... 174/262
2004/0149490 A1 * 8/2004 Chang et al. ............... 174/266

FOREIGN PATENT DOCUMENTS

| JP | A-5-167258 | 7/1993 |
| JP | A-10-163-632 | 6/1998 |
| JP | A-2001-352166 | 12/2001 |

OTHER PUBLICATIONS

English Translation Of JP 05-167258.*

* cited by examiner

*Primary Examiner*—George Fourson
*Assistant Examiner*—Thanh V. Pham
(74) *Attorney, Agent, or Firm*—Paul and Paul

(57) ABSTRACT

A semiconductor package of superior high frequency characteristics enabling easy mounting of a large-sized capacitor and thereby enabling fluctuation of the power supply voltage to be suppressed and enabling a reduction of the inductance of the wiring portion connecting the capacitor and a connection terminal, that is, a semiconductor package mounting a capacitor for suppressing fluctuation of a power supply voltage, wherein the capacitor is comprised of, in an attachment hole passing through the board in the thickness direction, a conductor wire to be connected to a connection terminal of a semiconductor chip at one end, a high dielectric constant material covering the conductor wire at a predetermined thickness, and a conductor layer arranged between the outer circumference of the high dielectric constant material and the inner wall of the attachment hole, provided as a coaxial structure having the conductor wire at its center, and a method of production of the same.

6 Claims, 3 Drawing Sheets

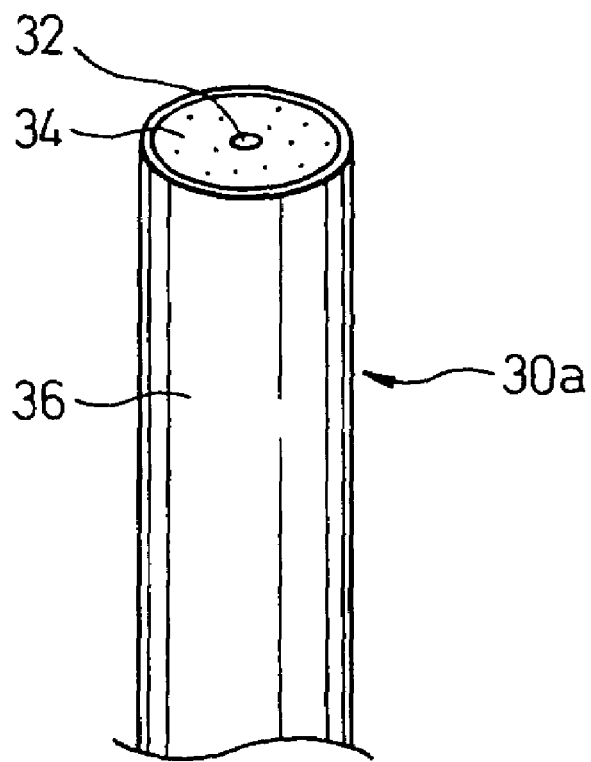 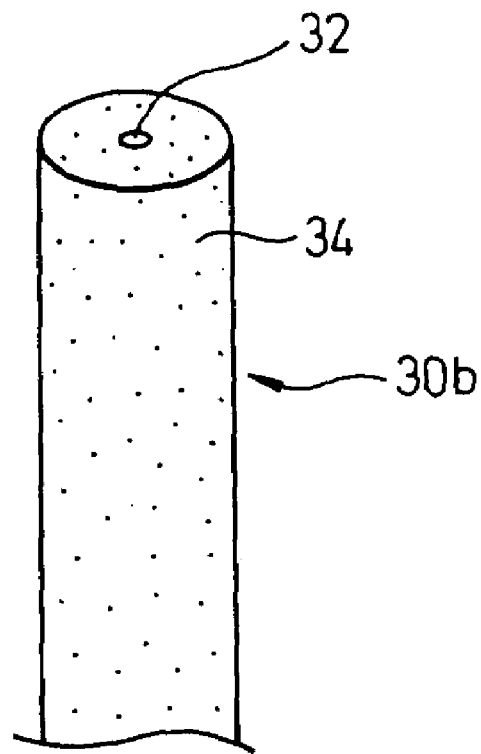

METHOD OF PRODUCTION OF SEMICONDUCTOR PACKAGE

CROSS-REFERENCE TO RELATED APPLICATIONS

This application is a divisional of U.S. patent application Ser. No. 10/281,791 filed Oct. 28, 2002, now Abandoned.

BACKGROUND OF THE INVENTION

1. Field of the Invention

The present invention relates to a semiconductor package and a method of production of the same, more particularly relates to a semiconductor package superior in high frequency characteristics and a method of production of the same.

2. Description of the Related Art

In semiconductor packages handling high frequency signals of microprocessors etc., the frequency characteristics in the signal transmission path become a problem. Therefore, the practice has been to prevent reflection of signals at the input and output terminals by matching the characteristic impedance or shortening the signal line as much as possible. For example, as methods of matching the characteristic impedance, there are the method of making the signal transmission path coplanar in shape to virtually form a coaxial line, the method of providing a recess in the circuit board and inserting a coaxial cable in the recess to obtain a coaxial structure (Japanese Unexamined Patent Publication (Kokai) No. 5-167258), etc. Further, as the method of shortening the signal line, the practice has been to arrange a chip capacitor and other circuit parts as close as possible to the connection terminals of the semiconductor chip.

Summarizing the problem to be solved by the invention, if however the frequency of the signal handled by the semiconductor package becomes a high one of 1 GHz, fluctuations in the power supply will have an effect on the frequency characteristics, so the practice has been to connect a large-sized capacitor to the power supply line so as to suppress any drop in power supply voltage when a signal is transmitted. In the case of a semiconductor device of the related art comprised of a semiconductor chip mounted on a circuit board, a capacitor has been mounted at the circuit by arranging a chip capacitor at the surface of the circuit board opposite to the surface mounting the semiconductor chip or arranging a chip capacitor in the vicinity of the semiconductor chip. This is so as to arrange the chip capacitor as close as possible to the connection terminal of the semiconductor chip and thereby reduce the inductance of the transmission path as much as possible.

The operating frequencies of semiconductor devices are becoming higher, however. If it becomes necessary to satisfy the condition of reducing the inductance value at the time of operation to not more than several pH, the problem arises that even with the method of arranging the chip capacitor at a position as close to the semiconductor chip as possible at the surface opposite to the position where the semiconductor chip is mounted, the inductance at the part connected with the electrode may end up exceeding the desired value depending on the thickness of the board or the size of the chip capacitor and the required performance of the semiconductor device will no longer be able to be obtained.

SUMMARY OF THE INVENTION

An object of the present invention is to provide a semiconductor package of superior high frequency characteristics enabling easy mounting of a large-sized capacitor and thereby enabling fluctuation of the power supply voltage to be suppressed and enabling a reduction of the inductance of the wiring portion connecting the capacitor and connection terminal and a method of production of the same.

To attain the above object, according to a first object of the present invention, there is provided a semiconductor package mounting a capacitor for suppressing fluctuation of a power supply voltage, wherein the capacitor is comprised of, in an attachment hole passing through a board in a thickness direction, a conductor wire to be connected to a connection terminal of a semiconductor chip at one end, a high dielectric constant material covering the conductor wire at a predetermined thickness, and a conductor layer arranged between an outer circumference of the high dielectric constant material and an inner wall of the attachment hole, provided as a coaxial structure having the conductor wire as its center.

Preferably, at least one of the signal wires provided at the board is comprised of, in an attachment hole passing through the board in a thickness direction, a signal wire at the core, a low dielectric constant material, and a conductor layer, formed as a coaxial cable part matching the impedance.

According to a second aspect of the present invention, there is provided a method of production of a semiconductor package mounting a capacitor for suppressing fluctuation of a power supply voltage, comprising providing an attachment hole passing through a board in a thickness direction and press-fitting into the attachment hole a capacitor cable comprised of a conductor wire at the core, a high dielectric constant material coaxially covering the conductor wire at a predetermined thickness, and a conductor sheath covering the outer circumference of the high dielectric constant material so as to attach the capacitor to the board.

According to a third aspect of the present invention, there is provided a method of production of a semiconductor package mounting a capacitor for suppressing fluctuation of a power supply voltage, comprising providing an attachment hole passing through a board in a thickness direction, forming a conductor layer at an inner wall of the attachment hole, and press-fitting into the attachment hole formed with the conductor layer a capacitor cable comprised of a conductor wire at the core and a high dielectric constant material coaxially covering the conductor wire at a predetermined thickness so as to attach the capacitor to the board.

BRIEF DESCRIPTION OF THE DRAWINGS

These and other objects and features of the present invention will become clearer from the following description of the preferred embodiments given with reference to the attached drawings, wherein:

FIGS. 3A and 3B are perspective views of capacitor cables used for the production of the semiconductor package.

DESCRIPTION OF THE PREFERRED EMBODIMENTS

Preferred embodiments of the present invention will be described in detail below while referring to the attached figures.

Figure 1:
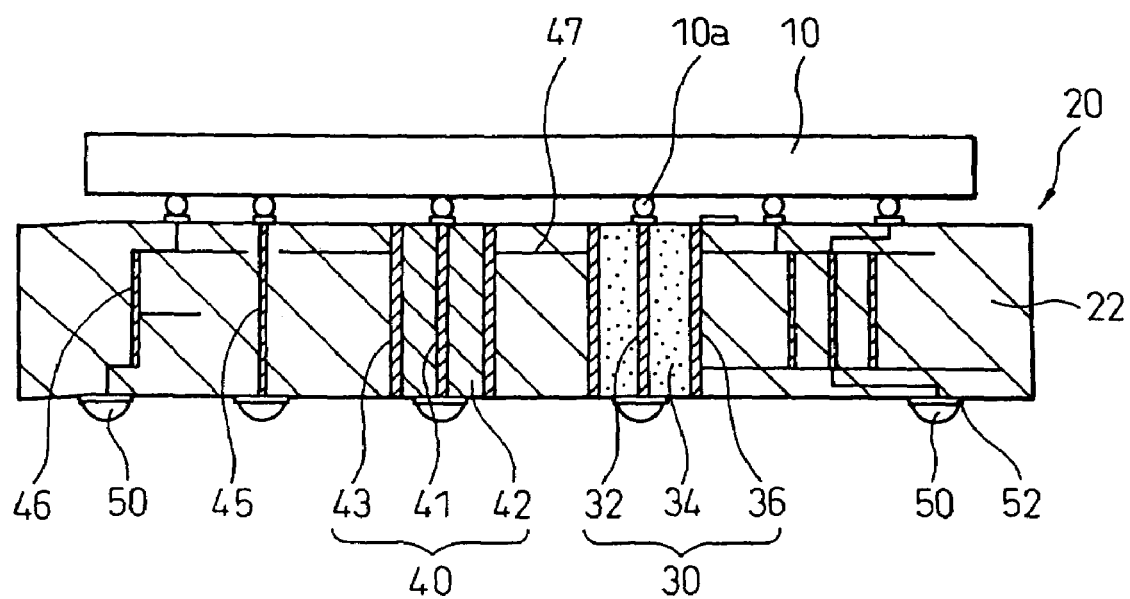
FIG. 1 is a sectional view of the state of a semiconductor package according to the present invention mounting a semiconductor chip.

FIG. 1 is a sectional view of the configuration of a semiconductor package according to an embodiment of the present invention. The figure shows the state of a semiconductor package 20 on which a semiconductor chip 10 is mounted. The characterizing feature of the semiconductor package of the present embodiment is the attachment of a capacitor 30 passing through a board 22 of the semiconductor package 20 matched with the position of arrangement of a connection terminal 10a of the semiconductor chip 10.

The capacitor 30 is comprised of a conductor wire 32, a high dielectric constant material 34 covering this at a predetermined thickness, and a conductor sheath 36 serving as a conductor layer covering the outer circumference of the high dielectric constant material 34. The conductor wire 32 and the conductor sheath 36 are arranged concentrically. The capacitor 30 formed by the conductor wire 32, high dielectric constant material 34, and conductor sheath 36 therefore has a coaxial structure. The high dielectric constant material 34 is for obtaining a required electrostatic capacitance between the conductor wire 32 and the conductor sheath 36. The conductor wire 32 and conductor sheath 36 act as electrodes of the capacitor 30. The high dielectric constant material 34 is formed by strontium titanate, barium titanate, or another high dielectric constant material or an organic material in which a high dielectric constant material is mixed as a filler in order to obtain the required electrostatic capacitance.

In the semiconductor package of the present embodiment, the capacitor 30 is used for the purpose of suppressing fluctuation of the power supply voltage, so the conductor wire 32 is connected to the power supply line and the conductor sheath 36 covering the outer circumference of the high dielectric constant material 34 is connected to a ground line to become the ground potential. Due to this, the capacitor 30 is provided between the power supply line and ground line of the electronic circuit.

As shown in FIG. 1, the capacitor 30 fits in an attachment hole passing through the board 22 in the thickness direction as a coaxial structure. The conductor wire 32 is directly connected to the connection terminal 10a of the semiconductor chip 10. The conductor wire 32 is arranged so as to pass through the capacitor 30 vertically. It is both a structural part of the capacitor 30 and wiring connecting the connection terminal 10a and the power supply. Due to this, the connection terminal 10a and the capacitor are connected at the shortest distance without any detour in the wiring. The length of the wiring connecting the capacitor 30 and the connection terminal 10a becomes the shortest and the inductance of the wiring portion becomes the smallest. Therefore, it is possible to effectively suppress deterioration of the characteristics when handling a high frequency signal of several GHz. In the structure of an ordinary semiconductor package, the inductance becomes 200 to 300 pH, but according to the present structure, it is possible to reduce the inductance to 10 to 50 pH.

In FIG. 1, reference numeral 40 is a coaxial cable part for impedance matching provided at the connection part of a signal line. Reference numeral 41 is a conductor wire serving as the signal line, 42 a low dielectric constant material, and 43 a conductor sheath covering the outer circumference of the low dielectric constant material 42. The conductor sheath 43 is connected to a ground wire and becomes the ground potential. The coaxial cable part 40 is characterized by formation into a coaxial structure for matching the impedance at the input/output terminals of the conductor wire 41 forming the signal wire with the characteristic impedance. The low dielectric constant material 42 is a dielectric material used for matching the characteristic impedance of 50Ω. The dielectric material forming the capacitor 30 has a specific dielectric constant of 30 to 40, while the low dielectric constant material 42 is a material of a low specific dielectric constant of about 3.

In the semiconductor package of the illustrated example, reference numeral 45 indicates a signal wire similar to the conductor wire 41, but this is not formed into a coaxial structure since this signal wire is for the input/output of a low frequency signal in the semiconductor package of this embodiment.

Reference numeral 46 is a ground wire. The ground wire 46 is electrically connected to the conductor sheaths 36 and 43 through an interconnect pattern 47 provided at an inside layer of the board 22, whereby the conductor sheaths 36 and 43 become the ground potential. Reference numerals 50 are external connection terminals provided at the bottom of the board 22. The external connection terminals 50 are formed by bonding solder balls with lands 52 formed on the surface of the board 22.

FIGS. 2A to 2D show the process of production of the above semiconductor package.

Figure 2A:
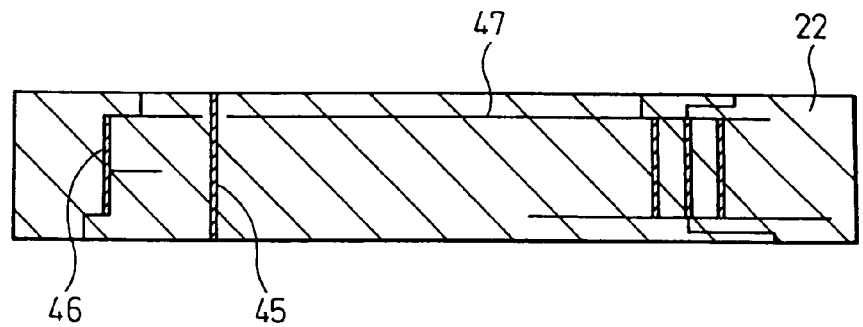
FIGS. 2A to 2D are sectional views of the process of production of a semiconductor package according to the present invention.

FIG. 2A shows a board 22 formed with conductor wires forming a signal wire 45 and a ground wire 46 and an interconnect pattern 47. The board 22 can be formed as a multilayer board comprised of a core board made of a resin on the two sides of which interconnect layers are laminated through insulation layers.

Figure 2B:
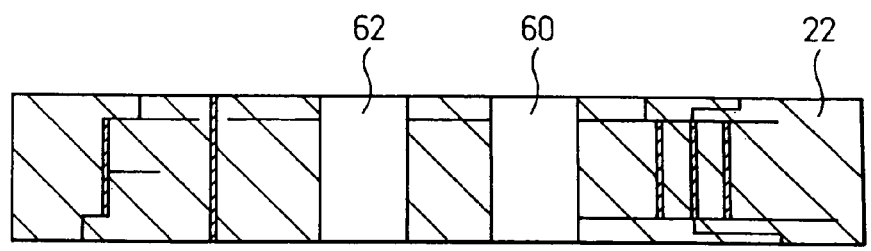

FIG. 2B shows the state with attachment holes 60 and 62 formed passing through the board 22 in the thickness direction. The attachment holes 60 and 62 are formed by drilling at portions for forming the above-mentioned capacitor 30 and high frequency signal use coaxial cable part 40. The attachment holes 60 and 62 are formed to have inside diameter dimensions matching the outside diameter dimensions of the capacitor 30 and coaxial cable part 40 to be attached to the board 22.

Figure 2C:
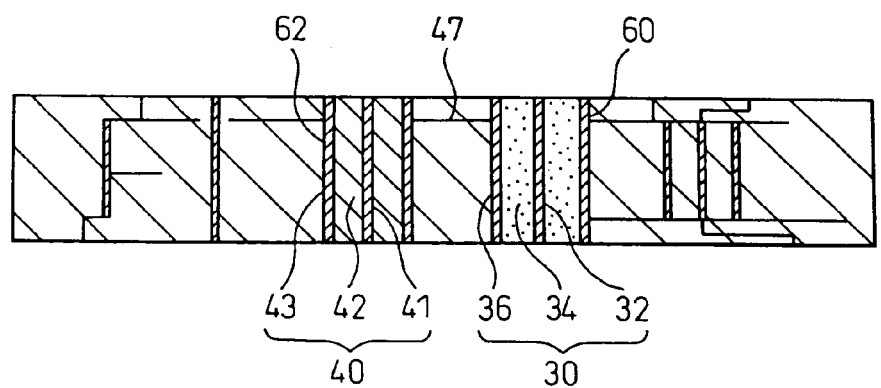

FIG. 2C shows the state with the capacitor 30 and the coaxial cable part 40 attached to the attachment holes 60 and 62 formed in the board 22. To attach the capacitor 30 to the attachment hole 60, a capacitor cable formed in advance into a cylindrical shape is inserted into the attachment hole 60.

FIG. 3A is a perspective view of a capacitor cable 30a. The capacitor cable 30a is comprised of the above-mentioned conductor wire 32, a high dielectric constant material 34, and a conductor sheath 36 formed into the shape of a long coaxial cable. The capacitor 30 can be attached by press-fitting the capacitor cable 30a cut to a predetermined length into the attachment hole 60 of the board 22.

By inserting the capacitor 30 into the attachment hole 60, the conductor sheath 36 contacts the interconnect pattern 47 exposed at the wall of the inner circumference of the attachment hole 60, whereby the interconnect pattern 47 and conductor sheath 36 are electrically connected.

Note that as the method of attaching the capacitor 30 to the attachment hole 60, aside from the method of using the capacitor cable 30a shown in FIG. 3A, the method of using a capacitor cable 30b shown in FIG. 3B is also possible. The capacitor cable 30b shown in FIG. 3B lacks the conductor sheath 36 of the capacitor cable 30a shown in FIG. 3A.

When using the capacitor cable 30b shown in FIG. 3B to attach the capacitor 30 to the board 22, first an attachment hole 60 is formed in the board 22, then the inside wall of the attachment hole 60 is plated to form a conductor layer at the inside wall of the attachment hole 60, then the capacitor cable 30b shown in FIG. 3B is press-fit in the attachment hole 60. In this case, the conductor layer becomes the ground potential, and the conductor layer provided at the inside wall of the attachment hole 60 performs the same function as the conductor sheath 36 of the capacitor cable 30a shown in FIG. 3A for formation of the capacitor 30.

The method of attaching the coaxial cable part 40 for a signal wire of the board 22 is similar to the method of attaching the capacitor 30 at the board 22. That is, it is possible to attach the coaxial cable part 40 shown in FIG. 2C by press-fitting a coaxial cable formed in the same manner as the capacitor cable 30a or 30b shown in FIG. 3A or 3B in the attachment hole 62 provided in the board 22. The coaxial cable may be formed with a conductor sheath at the outer surface of the low dielectric constant material 42 or not be formed with the conductor sheath. When no conductor sheath is formed at the outer surface of the low dielectric constant material 42, it is sufficient, in the same way as above, to plate the inner wall of the attachment hole 62 to form a conductor layer.

Figure 2D:
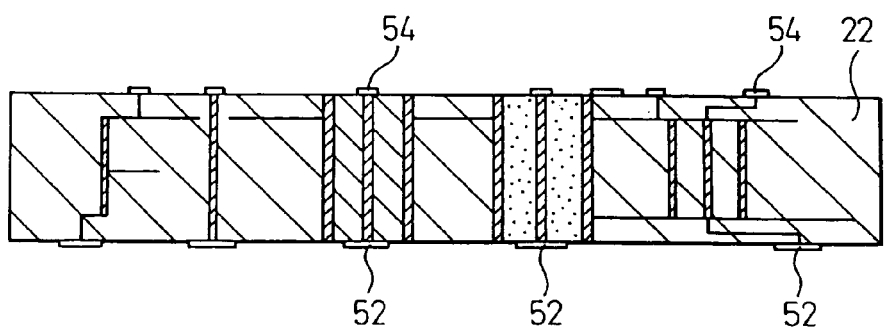

FIG. 2D shows the state of formation of an interconnect pattern on the surface of the board 22 after formation of the capacitor 30 and coaxial cable part 40 at the board 22. The interconnect pattern can be obtained by forming a conductor layer on the top and bottom surfaces of the board 22 by plating etc., then etching the conductor layer to form a predetermined pattern. Reference numerals 52 are lands for connection with external connection terminal, while reference numerals 54 are pads for connection with bumps of the semiconductor chip 10.

In this way, it is possible to obtain a semiconductor package mounting a capacitor 30 in an arrangement passing through the board 22 in the thickness direction. The semiconductor package of the present embodiment, as explained above, has the conductor wire 32 forming the power supply line serving as a part of the capacitor 30 and has the conductor wire 32 directly connected to the connection terminal 10a and the length of the power supply line formed shortest, so suppression of fluctuation of the power supply voltage and reduction of the inductance are realized and a package with extremely good high frequency characteristics is formed. Further, for the signal wire transmitting the high frequency signal, it is possible to improve the high frequency characteristics by matching with the characteristic impedance. In this respect as well, a semiconductor package superior in high frequency characteristics is obtained.

Summarizing the effects of the invention, according to the semiconductor package and method of production of the same of the present invention, it is possible to easily mount a capacitor to a board so as to suppress fluctuation of the power supply voltage and possible to minimize the length of the wiring connecting the capacitor and the connection terminal so as to lower the inductance. Therefore, it is possible to provide a semiconductor package with extremely superior high frequency characteristics.

While the invention has been described with reference to specific embodiments chosen for purpose of illustration, it should be apparent that numerous modifications could be made thereto by those skilled in the art without departing from the basic concept and scope of the invention.

What is claimed is:

1. A method of production of a semiconductor package having a capacitor for suppressing fluctuations of a voltage provided to a semiconductor device mounted to a board, comprising:
   providing a grounded interconnect pattern on an inside layer of said board,
   providing an attachment hole passing through said board and through said interconnect pattern, wherein said semiconductor device is mountable to said board with a connection terminal thereof over said attachment hole, and
   press-fitting into said attachment hole a capacitor cable comprised of a conductor wire at the core, a high dielectric constant material coaxially covering the conductor wire, and a conductive sheath covering the outer circumference of the high dielectric constant material, said conductive sheath being in press-fit electrical connection with said interconnect pattern,
   wherein said core conductor wire is in position to be connected to said semiconductor device connection terminal positioned over said attachment hole.

2. A method of production of a semiconductor package having a board to which a semiconductor device is mountable, said method mounting a capacitor for suppressing fluctuations of a voltage in a wire connectable to said semiconductor device, comprising:
   providing a grounded interconnect pattern on an inside layer of said board,
   making a hole passing through said board for passing a voltage wire to a said semiconductor device mounted to said board, said hole passing through said interconnect pattern and exposing said interconnect pattern at an inside wall thereof,
   forming a conductive layer on said inside wall of said hole, said conductive layer being in contact with said exposed interconnect pattern, and
   press-fitting into said hole a conductor wire for connection to said semiconductor device, said conductor wire having a high dielectric constant material coaxially covering the conductor wire, said dielectric material being in press fit contact with said formed conductive layer, wherein a capacitor is established with one element thereof being said conductor wire connectable to said semiconductor device and the other element thereof being conductive layer on said inside wall of said hole in press fit contact with said interconnect pattern.

3. A method of connecting a capacitor in proximity to a connection terminal of a semiconductor device mountable to a printed circuit like board, comprising the steps of:
   providing a grounded interconnect pattern on an inside layer of said board;
   making an attachment hole through said board for passing a voltage connection wire there through to said semiconductor device, said hole extending though said interconnect pattern and exposing it at an inside wall of said hole;
   providing a voltage conductor wire suitable for connection to said semiconductor device;
   surrounding said voltage conductor wire with a coaxial thickness of high dielectric constant material;
   surrounding said high dielectric constant material with an outer coaxial conductive layer to complete the forming of a capacitor; cable in press fit contact with said exposed interconnect pattern at said inside wall of said hole and placing said formed capacitor cable through said hole with said outter coaxial conductive layer and where said voltage conductor wire connectable to with said conductor,
wherein a coaxial capacitor is established with one element being said voltage conductor wire to said semiconductor device and the other element being said outer conductive layer in press fit with said exposed interconnect pattern.

4. The method of claim 3, wherein said voltage conductor wire surrounding step includes coating said voltage conductor with a predetermined thickness of said high dielectric constant material, and wherein said dielectric material surrounding step includes surrounding said dielectric material with a conductive sheath covering to form a capacitive cable, wherein said press fit contact is effected by press fitting said capacitive cable into said hole wherein said conductive sheath covering is in press fit contact with said exposed interconnect pattern at said inside wall thereof.

5. The method of claim 3, wherein said voltage conductor wire surrounding step includes coating said voltage conductor wire with a predetermined thickness of said high dielectric constant material, and wherein said dielectric material surrounding step includes coating said hole with a conductive layer, wherein said conductive layer is in contact with said exposed interconnect layer, and then press fitting said dielectric coated conductor wire into said conductive layer coated hole.

6. The method of claim 5 wherein the step of coating said hole with a conductive layer is plating said hole with a conductive layer.

* * * * *